US011113176B2

(12) United States Patent
Pelton et al.

(10) Patent No.: US 11,113,176 B2
(45) Date of Patent: Sep. 7, 2021

(54) GENERATING A DEBUGGING NETWORK FOR A SYNCHRONOUS DIGITAL CIRCUIT DURING COMPILATION OF PROGRAM SOURCE CODE

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 170 days.

(21) Appl. No.: 16/247,203

(22) Filed: Jan. 14, 2019

(65) Prior Publication Data

US 2020/0226051 A1 Jul. 16, 2020

(51) Int. Cl.
G06F 11/00 (2006.01)
G06F 11/36 (2006.01)

(52) U.S. Cl.
CPC ...... G06F 11/3624 (2013.01); G06F 11/3664 (2013.01)

(58) Field of Classification Search
CPC .................. G06F 11/3624; G06F 11/3664
See application file for complete search history.

(56) References Cited

U.S. PATENT DOCUMENTS 5,343,554 A 8/1994 Koza et al.
5,416,719 A 5/1995 Pribetich
5,642,304 A 6/1997 Simpson
5,761,483 A 6/1998 Trimberger
5,909,572 A 6/1999 Thayer et al.
6,061,521 A 5/2000 Thayer et al.
6,112,019 A 8/2000 Chamdani et al.
6,212,601 B1 4/2001 Shiell
(Continued)

FOREIGN PATENT DOCUMENTS

WO 2016094012 A1 6/2016
WO 2017084104 A1 5/2017

OTHER PUBLICATIONS

"Final Office Action Issued in U.S. Appl. No. 16/247,250", dated Apr. 13, 2020, 22 Pages.
(Continued)

*Primary Examiner* — Joshua P Lottich
(74) *Attorney, Agent, or Firm* — Newport IP, LLC; Jacob P. Rohwer; Leonard J. Hope

(57) ABSTRACT

Program source code defined in a multi-threaded imperative programming language can be compiled into a circuit description for a synchronous digital circuit ("SDC") that includes pipelines and queues. During compilation, data defining a debugging network for the SDC can be added to the circuit description. The circuit description can then be used to generate the SDC such as, for instance, on an FPGA. A CPU connected to the SDC can utilize the debugging network to query the pipelines for state information such as, for instance, data indicating that an input queue for a pipeline is empty, data indicating the state of an output queue, or data indicating if a wait condition for a pipeline has been satisfied. A profiling tool can execute on the CPU for use in debugging the SDC.

20 Claims, 6 Drawing Sheets

(56) References Cited

U.S. PATENT DOCUMENTS

| | | |
|---|---|---|
| 6,275,508 B1 | 8/2001 | Aggarwal et al. |
| 6,597,664 B1 | 7/2003 | Mithal et al. |
| 7,028,281 B1 | 4/2006 | Agrawal et al. |
| 7,111,273 B1 | 9/2006 | Ganesan et al. |
| 7,203,718 B1 | 4/2007 | Fu et al. |
| 7,305,582 B1 | 12/2007 | Moser et al. |
| 7,315,991 B1 | 1/2008 | Bennett |
| 7,375,550 B1* | 5/2008 | Redgrave ............... G06F 7/764 326/38 |
| 7,386,820 B1 | 6/2008 | Koelbl et al. |
| 7,415,681 B2 | 8/2008 | Tomar et al. |
| 7,471,104 B1 | 12/2008 | Chirania |
| 7,516,446 B2 | 4/2009 | Choi et al. |
| 7,647,567 B1 | 1/2010 | Esposito et al. |
| 7,735,047 B1 | 6/2010 | Anderson et al. |
| 7,735,050 B2 | 6/2010 | Yu et al. |
| 7,823,117 B1 | 10/2010 | Bennett |
| 7,844,924 B2 | 11/2010 | Sasao et al. |
| 8,095,508 B2 | 1/2012 | Chamberlain et al. |
| 8,209,580 B1 | 6/2012 | Varnica et al. |
| 8,468,510 B1 | 6/2013 | Sundararajan et al. |
| 8,599,049 B2 | 12/2013 | Wang et al. |
| 8,620,881 B2 | 12/2013 | Chamberlain et al. |
| 8,656,347 B2 | 2/2014 | Ito |
| 8,671,371 B1 | 3/2014 | Dimond |
| 8,775,986 B1 | 7/2014 | Mohan et al. |
| 8,881,079 B1 | 11/2014 | Pan et al. |
| 8,930,926 B2 | 1/2015 | Bastoul et al. |
| 9,471,307 B2 | 10/2016 | Giroux et al. |
| 9,690,278 B1 | 6/2017 | Chen et al. |
| 9,824,756 B2 | 11/2017 | Brand et al. |
| 9,846,623 B2 | 12/2017 | Jennings et al. |
| 9,858,373 B2 | 1/2018 | Cho et al. |
| 10,162,918 B1 | 12/2018 | Iyer et al. |
| 10,331,836 B1 | 6/2019 | Hosangadi et al. |
| 10,474,533 B2 | 11/2019 | Jennings et al. |
| 2002/0080174 A1 | 6/2002 | Kodosky et al. |
| 2003/0154466 A1 | 8/2003 | Snider |
| 2005/0050531 A1 | 3/2005 | Lee |
| 2006/0075180 A1 | 4/2006 | Tian et al. |
| 2006/0120189 A1 | 6/2006 | Beerel et al. |
| 2006/0268939 A1 | 11/2006 | Dries et al. |
| 2007/0094474 A1 | 4/2007 | Wilson et al. |
| 2007/0143717 A1 | 6/2007 | Koelbl et al. |
| 2007/0171101 A1 | 7/2007 | Siemers et al. |
| 2007/0174804 A1 | 7/2007 | Sasao et al. |
| 2007/0180334 A1* | 8/2007 | Jones .................... G06F 11/362 714/45 |
| 2007/0300192 A1 | 12/2007 | Curtin et al. |
| 2008/0005357 A1 | 1/2008 | Malkhi et al. |
| 2008/0075278 A1 | 3/2008 | Gaubatz et al. |
| 2008/0111721 A1 | 5/2008 | Reznik |
| 2008/0111722 A1 | 5/2008 | Reznik |
| 2008/0229141 A1* | 9/2008 | Chang ................ G06F 11/2236 714/3 |
| 2008/0313579 A1* | 12/2008 | Larouche ............. G06F 30/331 716/103 |
| 2009/0210412 A1 | 8/2009 | Oliver et al. |
| 2009/0243732 A1 | 10/2009 | Tarng et al. |
| 2010/0162049 A1* | 6/2010 | Stall .................... G06F 11/3624 714/38.14 |
| 2011/0078640 A1 | 3/2011 | Bruneel |
| 2012/0065956 A1 | 3/2012 | Irturk et al. |
| 2013/0013301 A1 | 1/2013 | Subbaraman et al. |
| 2013/0054939 A1 | 2/2013 | Felch |
| 2013/0081060 A1 | 3/2013 | Otenko |
| 2013/0100750 A1 | 4/2013 | Ishiguro et al. |
| 2013/0111425 A1 | 5/2013 | Kumar et al. |
| 2013/0111453 A1 | 5/2013 | Kalogeropulos et al. |
| 2013/0125097 A1 | 5/2013 | Ebcioglu et al. |
| 2013/0139122 A1 | 5/2013 | Pell et al. |
| 2013/0212365 A1 | 8/2013 | Chen et al. |
| 2013/0226594 A1 | 8/2013 | Fuchs et al. |
| 2013/0298130 A1 | 11/2013 | Pienaar et al. |
| 2013/0335853 A1 | 12/2013 | Li et al. |
| 2014/0059524 A1 | 2/2014 | Kee et al. |
| 2014/0237437 A1 | 8/2014 | Mang et al. |
| 2015/0052298 A1 | 2/2015 | Brand et al. |
| 2015/0178418 A1 | 6/2015 | Gu et al. |
| 2015/0178435 A1 | 6/2015 | Kumar |
| 2015/0295552 A1 | 10/2015 | Abou-chahine et al. |
| 2015/0304068 A1 | 10/2015 | Xiong et al. |
| 2016/0087651 A1 | 3/2016 | Lu |
| 2016/0180001 A1 | 6/2016 | Adler |
| 2016/0246571 A1 | 8/2016 | Walters, III |
| 2016/0259023 A1* | 9/2016 | Overall ............... G01R 33/546 |
| 2016/0299998 A1 | 10/2016 | Isshiki |
| 2017/0140513 A1 | 5/2017 | Su et al. |
| 2017/0185508 A1* | 6/2017 | Looney ............ G06F 11/3664 |
| 2017/0192921 A1 | 7/2017 | Wang et al. |
| 2017/0251211 A1 | 8/2017 | Froehlich et al. |
| 2017/0277656 A1 | 9/2017 | John et al. |
| 2017/0316154 A1* | 11/2017 | Fitch .................... G16B 50/00 |
| 2018/0129475 A1 | 5/2018 | Almagambetov et al. |
| 2018/0143872 A1 | 5/2018 | Sun et al. |
| 2018/0232475 A1 | 8/2018 | Derisavi et al. |
| 2018/0253368 A1 | 9/2018 | Villarreal et al. |
| 2018/0255206 A1 | 9/2018 | Kim et al. |
| 2018/0330022 A1 | 11/2018 | Choi et al. |
| 2018/0342040 A1 | 11/2018 | Nguyen et al. |
| 2018/0347498 A1 | 12/2018 | Maloney |
| 2019/0114548 A1 | 4/2019 | Wu et al. |
| 2019/0138365 A1 | 5/2019 | Purnell et al. |
| 2019/0303153 A1 | 10/2019 | Halpern et al. |
| 2020/0167139 A1 | 5/2020 | Drepper |
| 2020/0225919 A1 | 7/2020 | Pelton et al. |
| 2020/0225920 A1 | 7/2020 | Pelton et al. |
| 2020/0225921 A1 | 7/2020 | Pelton et al. |
| 2020/0226227 A1 | 7/2020 | Pelton et al. |
| 2020/0226228 A1 | 7/2020 | Pelton et al. |
| 2021/0049163 A1 | 2/2021 | Levy et al. |

OTHER PUBLICATIONS

"Non Final Office Action Issued in U.S. Appl. No. 16/247,226", dated Sep. 4, 2020, 33 Pages.

"Operand Forwarding", Retrieved From: https://en.wikipedia.org/w/index.php?title=Operand_forwarding&oldid=868126536, Retrieved on: Nov. 10, 2018, 2 Pages.

"Register File", Retrieved From: https://en.wikipedia.org/w/index.php?title=Register_file&oldid=923242007, Retrieved on: Oct. 27, 2019, 8 Pages.

"Re-order Buffer", Retrieved From: https://en.wikipedia.org/w/index.php?title=Re-order_buffer&oldid=928835149 Retrieved on: Dec. 1, 2019, 1 Page.

"Non-Final Office Action Issued in U.S. Appl. No. 16/247,250", dated Dec. 27, 2019, 14 Pages.

"Ex Parte Quayle Action Issued in U.S. Appl. No. 16/247,261", dated Feb. 4, 2020, 7 Pages.

"Non Final Office Action Issued in U.S. Appl. No. 16/247,269", dated Feb. 20, 2020, 14 Pages.

Cong, et al., "Combinational Logic Synthesis for LUT Based Filed Programmable Gate Arrays", In Proceedings of the ACM Transactions on Design Automation of Electronic Systems, Apr. 1996, pp. 145-204.

Tan, et al., "Mapping-Aware Constrained Scheduling for LUT-Based FPGAs", In Proceedings of the ACM/SIGDA International Symposium on Field-Programmable Gate Arrays, Feb. 22, 2015, 10 Pages.

Ditmar, et al., "Function Call Optimisation in SystemC Hardware Compilation", In Proceedings of 4th Southern Conference on Programmable Logic, Mar. 26, 2008, pp. 93-98.

"International Search Report and Written Opinion Issued in PCT Application No. PCT/US2019/069028", dated Apr. 24, 2020, 13 Pages.

"International Search Report and Written Opinion Issued in PCT Application No. PCT/US2019/069031", dated May 4, 2020, 13 Pages.

(56) References Cited

OTHER PUBLICATIONS

"International Search Report and Written Opinion Issued in PCT Application No. PCT/US2019/069032", dated Apr. 24, 2020, 13 Pages.
"International Search Report and Written Opinion Issued in PCT Application No. PCT/US2020/012278", dated Apr. 6, 2020, 15 Pages.
Arar, Steve, "Concurrent Conditional and Selected Signal Assignment in VHDL", https://www.allaboutcircuits.com/technical-articles/concurrent-conditional-and-selected-signal-assignment-in-vhdl/, Jan. 3, 2018, 8 Pages.
Galloway, et al., "The Transmogrifier C hardware description language and compiler for FPGAs", In Proceedings IEEE Symposium on FPGAs for Custom Computing Machines, Apr. 19, 1995, pp. 136-144.
"International Search Report and Written Opinion Issued in PCT Application No. PCT/US2019/069034", dated Jun. 23, 2020, 19 Pages.
"Non-Final Office Action Issued in U.S. Appl. No. 16/247,181", dated Jul. 9, 2020, 11 Pages.
"International Search Report and Written Opinion Issued in PCT Application No. PCT/US2019/069030", dated Mar. 27, 2020, 11 Pages.
"Non Final Office Action Issued in U.S. Appl. No. 16/247,250", dated Nov. 12, 2020, 18 Pages.
"Final Office Action Issued in U.S. Appl. No. 16/247,269", dated Oct. 16, 2020, 15 Pages.
"Final Office Action Issued in U.S. Appl. No. 16/247,181", dated Jan. 28, 2021, 16 Pages.
"Final Office Action Issued in U.S. Appl. No. 16/247,226", dated Mar. 18, 2021, 41 Pages.
"Notice of Allowance Issued in U.S. Appl. No. 16/247,250", dated Apr. 14, 2021, 25 Pages.
Hatami, et al., "High Performance Architecture for Flow-Table Lookup in SDN on FPGA", In Repository of arXiv:1801.00840, Jan. 2, 2018, 15 Pages.
"Non Final Office Action Issued in U.S. Appl. No. 16/247,181", dated Jun. 9, 2021, 13 Pages.
"Notice of Allowance Issued in U.S. Appl. No. 16/247,226", dated Jun. 25, 2021, 14 Pages.
Steinberg, et al., "Automatic High-level Programs Mapping onto Programmable Architectures", In Proceedings of International Conference on Parallel Computing Technologies, Jul. 25, 2015, pp. 474-485.

* cited by examiner

GENERATING A DEBUGGING NETWORK FOR A SYNCHRONOUS DIGITAL CIRCUIT DURING COMPILATION OF PROGRAM SOURCE CODE

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Additionally, because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

It can also be difficult for engineers to debug hardware circuits generated from HDL. For example, it can be difficult for engineers to identify portions of a hardware circuit generated from HDL that are causing performance bottlenecks and to diagnose hardware hangs.

It is with respect to these and other technical challenges that the disclosure made herein is presented.

SUMMARY

Technologies are disclosed for generating a debugging network for a synchronous digital circuit ("SDC") during compilation of program source code used to generate the SDC. The program source code can be defined using a multi-threaded imperative programming language. Through implementations of the disclosed technologies, hardware engineers can more easily create and debug SDCs, thereby improving performance of the circuits and reducing or eliminating the likelihood of hardware hangs. Other technical benefits not specifically mentioned herein can also be realized through implementations of the disclosed subject matter.

In order to realize the technical benefits mentioned briefly above, program source code is generated in a multi-threaded imperative programming language and stored. The programming language is imperative in that program statements are executed one after another, and multi-threaded in that multiple threads of execution can be executing in parallel. A thread refers to a collection of local variables. Threads are executed as the local variables are processed by a hardware circuit.

In one configuration, program source code is defined and stored that can be compiled to generate a SDC. The program source code can be expressed using a multi-threaded imperative programming language, such as that described briefly above. The SDC generated using the program source code includes pipelines that are connected by queues. The pipelines implement the functionality defined by the program source code. The queues enable the exchange of data between the pipelines.

The program source code defined in the multi-threaded imperative programming language can be compiled into a circuit description for the SDC such as, for instance, HDL. During compilation, data defining a debugging network for the SDC can be added to the circuit description. In one configuration, the debugging network includes serial connections to the pipelines, thereby implementing a loop network topology. Other topologies, such as for instance a chain topology, can be used in other configurations.

A central processing unit ("CPU") connected to the SDC can utilize the debugging network to query the pipelines for state information. The state information describes aspects of the operation of the pipelines such as, for instance, data indicating that an input queue for a pipeline is empty, data indicating the state of an output queue for a pipeline (e.g. data indicating the queue is full or almost full) or data indicating whether a wait condition for a pipeline has been satisfied.

The circuit description generated by compilation in the manner described above can, in turn, be used to generate a SDC that includes the circuit implementation. For example, HDL might be utilized to generate a Field-Programmable Gate Array ("FPGA") image or bitstream that defines the circuit implementation. The FPGA image or bitstream can, in turn, be utilized to program an FPGA that embodies the circuit implementation, including the debugging network. The HDL can be passed to an EDA tool, which can be utilized to generate a Gate Array or Application-Specific Integrated Circuit ("ASIC").

Engineers can then utilize the debugging network to debug the SDC, thereby improving performance of the circuit and reducing or eliminating the likelihood of hardware hangs. Other technical benefits not specifically identified herein can also be realized through implementations of the disclosed technologies.

It should be appreciated that aspects of the subject matter described herein can be implemented as a computer-controlled apparatus, a computer-implemented method, a computing device, a SDC, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
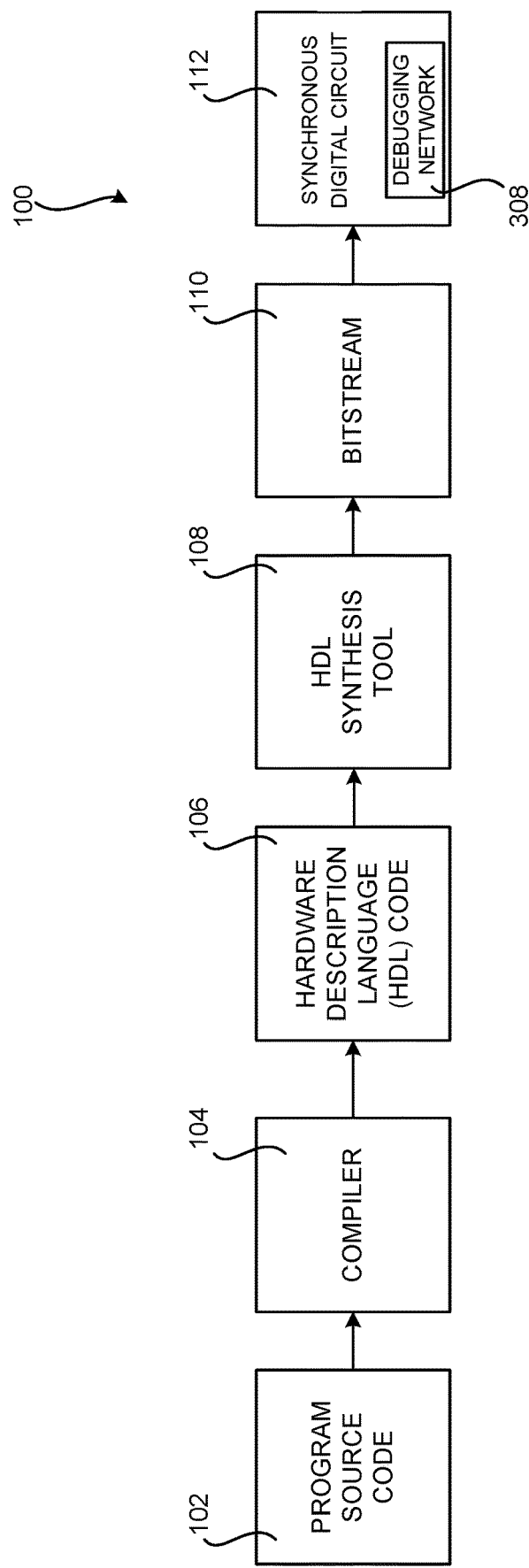
FIG. 1 is a computing architecture diagram that shows aspects of a system disclosed herein for generating a synchronous digital circuit that includes a debugging network.

The following detailed description is directed to technologies for generating a debugging network for a SDC during compilation of program source code in a multi-threaded imperative programming language that can be compiled to generate the SDC. As discussed briefly above, implementations of the technologies disclosed herein enable engineers to more easily debug SDCs, thereby improving performance and reducing the likelihood of hardware hangs. Other technical benefits not specifically mentioned herein can also be realized through implementations of the disclosed subject matter.

While the subject matter described herein is presented in the general context of a computing system executing a compiler configured for generating a debugging network for an SDC, those skilled in the art will recognize that other implementations can be performed in combination with other types of computing systems and modules. Those skilled in the art will also appreciate that the subject matter described herein can be practiced with other computer system configurations, including hand-held devices, multi-processor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for generating a debugging network for a SDC during compilation of program source code will be described.

FIG. 1 is a computing architecture diagram that shows aspects of an illustrative system 100 disclosed herein for defining and generating a synchronous digital circuit ("SDC") 112 that includes a debugging network 308. As mentioned briefly above, SDCs 112 can be implemented by Gate Arrays, FPGAs, ASICs, and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As shown in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

The program source code 102 is expressed using a multi-threaded imperative programming language designed to target SDCs 112. This programming language provides many of the features of languages such as 'C' and 'JAVA, such as function calls, for-loops, arithmetic operators, and conditional statements. This enables both hardware and software engineers to reason about performance, and to be effective in optimizing their designs. This can also make the language familiar to software engineers, and free hardware engineers from dealing with whole classes of bugs that arise when coding in an HDL.

The multi-threaded imperative programming language used to define the program source code 102 is imperative in that program statements are executed one after another, and multi-threaded in that multiple threads of execution can be executing in parallel. As discussed above, a thread is a collection of local variables. Threads are executed as the local variables are processed by a hardware circuit.

The threads described herein are analogous to, yet different, from software threads. While a software thread maintains a call stack containing local variables and executes code in memory, the threads described herein are collections of local variables that move through hardware circuits. Moreover, while a software thread has a location in executable code determined by an instruction pointer, the disclosed threads have a physical location on the SDC at a given point in time. SDCs may execute hundreds, thousands, or even millions of threads.

SDC 112 execution may be pipelined—i.e. different threads may execute within different stages of a circuit at the same time. In order to provide this functionality, the SDC 112 generated using the program source code 102 can include pipelines (not shown in FIG. 1) that are connected by queues (also not shown in FIG. 1). The pipelines implement the functionality defined by the program source code 102. The queues enable the exchange of data between the pipelines.

A compiler 104 can compile the program source code 102 to a circuit description, HDL code 106 in this example. The HDL code 106 can be provided to an HDL synthesis tool 108 which, in turn, can generate a bitstream 110 that can be utilized to program an SDC 112, such as for instance on an FPGA. When targeting an ASIC, the HDL code 106 can be provided to an ASIC fabricator for production in a factory.

As will be described in greater detail below with regard to FIGS. 3 and 4, the compiler 104 can also add data (e.g. HDL) defining a debugging network 308 for the SDC 112 to the circuit description at compilation time. A CPU (not shown in FIG. 1) connected to the SDC 112 can utilize the debugging network 308 to query pipelines in the SDC 112 for state information such as, for instance, data indicating that an input queue for a pipeline is empty, data indicating the state of an output queue (e.g. data indicating the number of variables in an output queue, or that an output queue is full or almost full), or data indicating if a wait condition for a pipeline has been satisfied.

Hardware and software engineers can utilize the debugging network 308 to debug the SDC 112, thereby improving performance of the SDC 112 and reducing the likelihood of hardware hangs. Additional details regarding one process for debugging an SDC 112 using a debugging network 308 are provided below.

Figure 2:
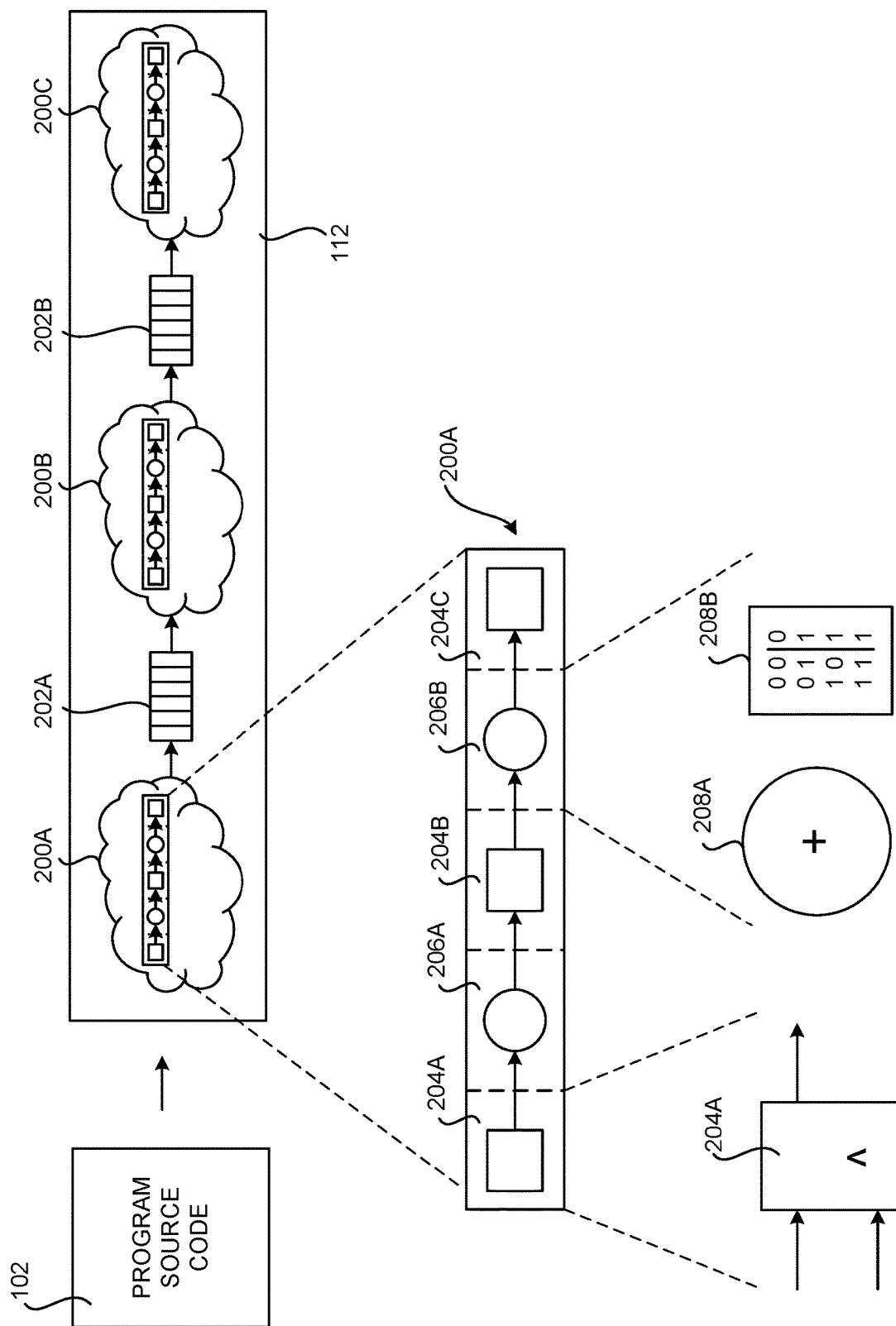
FIG. 2 is a hardware architecture diagram showing aspects of an illustrative example synchronous digital circuit, that includes several hardware pipelines, each having multiple pipeline stages, and computational units that can be defined and implemented using the disclosed technologies.

FIG. 2 is a hardware architecture diagram showing aspects of an example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement circuitry (which might be referred to herein as "arbitration logic") that determines when to retrieve the next value(s) from a FIFO 202. For example, a policy may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as an adder 208A or a lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register 204A or 204B can be provided to other computational units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers 204 can also include an enable line. If an enable line is set to false, then the register 204 will not perform the operations described above, maintaining the current output value over multiple clock cycles.

It is to be appreciated that the pipeline architecture shown in FIG. 2 has been simplified for discussion purposes. The programming language described herein can be utilized to implement much more complex SDCs 112 that include many more components than illustrated in FIG. 2.

Figure 3:
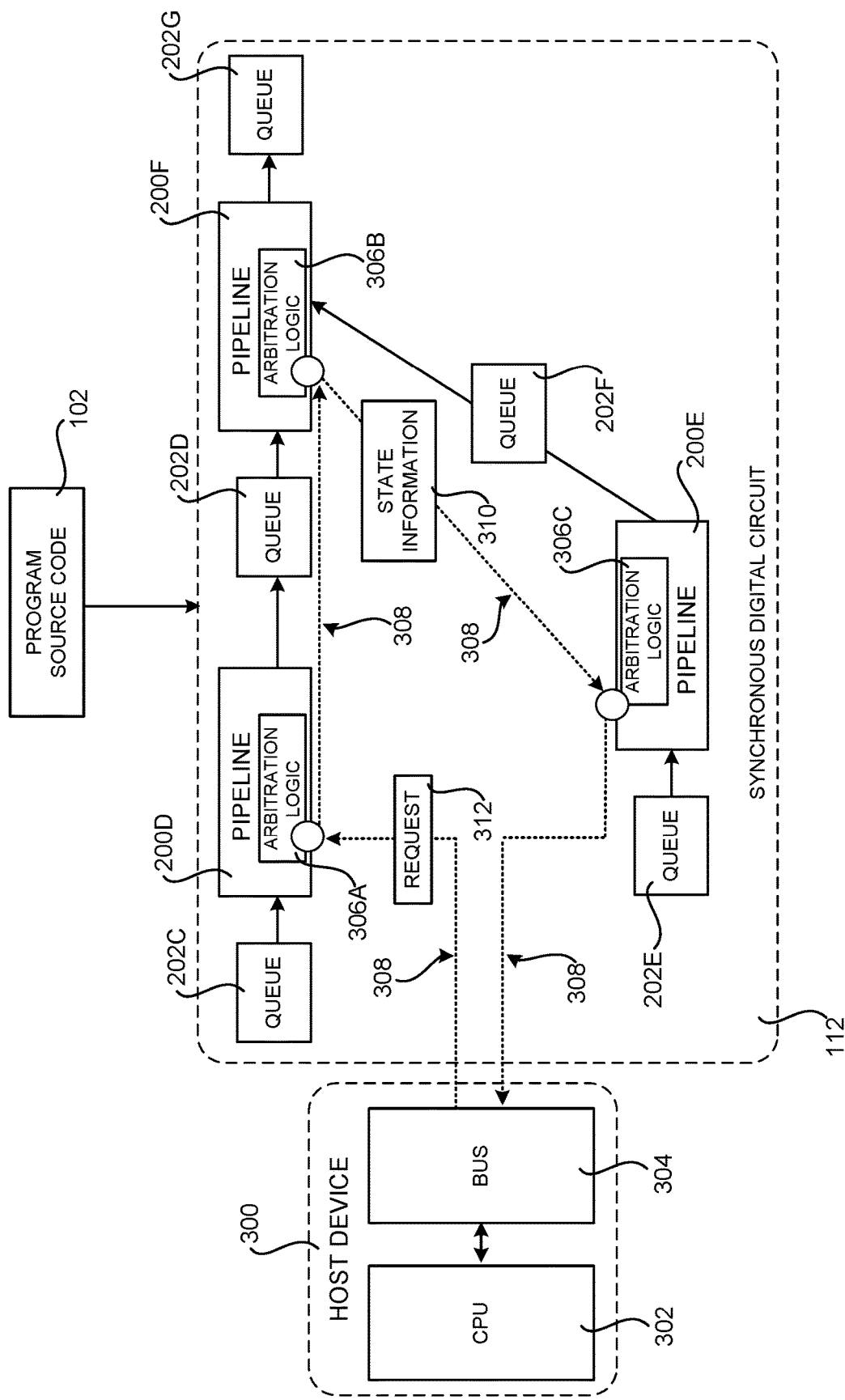
FIG. 3 is a hardware architecture diagram that shows aspects of an illustrative synchronous digital circuit created using the technologies disclosed herein that includes a debugging network.

FIG. 3 is a hardware architecture diagram that shows aspects of an illustrative synchronous digital circuit 112 created using the technologies disclosed herein that includes a debugging network 308. In the example shown in FIG. 3, program source code 102 in a multi-threaded imperative programming language has been created and stored that defines a SDC 112 that includes three pipelines 200D-200F and five queues 202C-202G. The pipeline 200D obtains its input from the queue 202C and provides its output to the queue 202D. The pipeline 200F obtains its input from the queue 202D and the queue 202F and provides its output to the queue 202G. The pipeline 200E obtains its input from the queue 202E.

As shown in FIG. 3 and described briefly above, the pipelines 200 can implement arbitration logic 306 that determines when to retrieve the next value(s) from a queue 202. For example, the arbitration logic 306A may require that the input queue 202C is not empty and that the output queue 202D is not full before the pipeline 200D will retrieve a value from the input queue 202C for processing.

In the case of the pipeline 200F, the arbitration logic 306B might require, for example, that a wait condition is satisfied before retrieving a value from the queue 202D or the queue 202F. The arbitration logic 306C in the pipeline 200E might require that the input queue 202E is not empty and that the output queue 202F is not full before retrieving a value from the input queue 202E. Other types of policy can be defined and implemented by the arbitration logic 306 in the pipelines 200 of a SDC 112.

As shown in FIG. 3, the SDC 112 can include a debugging network 308 through which a CPU 302 of a host device 300 can obtain state information 310 from the pipelines 200. The CPU 302 can be local to the SDC 112 or located remotely from the SDC 112 and connected by way of a suitable computing network. The state information 310 describes aspects of the operation of the pipelines 200 such as, for instance, data indicating that an input queue 202 for a pipeline 200 is empty, data indicating that an output queue 202 for a pipeline 200 is full or almost full, or data indicating whether a wait condition for a pipeline 200 has been satisfied. The state information 310 can describe other aspects of the operation of a pipeline 200, including its arbitration logic 306.

In some configurations, a profiling tool can execute on the CPU 302 and sample data from the debugging network 308 on a regular basis. The profiling tool can aggregate the data and compute various statistics describing aspects of the operation of the SDC 112. For example, and without limitation, for each pipeline 200 the profiling tool might report the percentage of idle time, percentage of busy time, percentage of time blocked on output full, and percentage of time blocked on wait condition. This data can be utilized to identify bottlenecks in the SDC 112 and other types of problems.

In one configuration, the debugging network 308 includes serial connections to the pipelines 200 of an SDC 112, thereby implementing a loop network topology. For instance, in the example configuration shown in FIG. 3, the debugging network 308 includes a connection from a host bus 304 to the arbitration logic 306A of the pipeline 200D, a connection from the arbitration logic 306A of the pipeline 200D to the arbitration logic 306B of the pipeline 200F, a connection from the arbitration logic 306B of the pipeline 200F to the arbitration logic 306C and, finally, a connection from the arbitration logic 306C back to the host bus 304. As mentioned above, other topologies can be used in other configurations.

In order to query the pipelines 200 for state information 310, the CPU 302 can transmit a request 312 for state information 310 on the debugging network 308. The request 312 specifies a particular pipeline 200 for which state information 310 is requested. The request 312 will be passed along the connections of the debugging network 308 until it reaches its target pipeline 200. In the example shown in FIG.

3, for instance, the request 312 is destined for the pipeline 200F. In response thereto, the pipeline 200 places its state information 310 on the debugging network 308 which, in turn, is returned to the CPU 302 in response to the original request 312.

In order to generate the debugging network 308 in the SDC 112, the compiler 104 adds data to the circuit description (e.g. the HDL 106) that defines the debugging network 308. As discussed above, the HDL synthesis tool 108 can generate a bitstream 110 from the circuit description that can then be utilized to create the SDL 112, including the debugging network 308, in an FPGA, for instance. Because the compiler 104 adds the data defining the debugging network 308 to the circuit description, the creator of the program source code 102 does not have to manually define the debugging network 308 for the SDC 112.

Once a SDC 112 with a debugging network 308 has been created in the manner described above, an engineer can utilize a host device 300 connected to the SDC 112 to debug aspects of its operation. For example, a program can be executed on the host device 300 to generate requests 312 for state information 310, such as that described above. The requests 312 might be generated manually in response to user input or might be generated automatically, such as for example by sampling the state information 310 for pipelines 200 on a regular basis. Requests 312 might also be generated automatically by the CPU 302 when the CPU 302 detects that the SDC 112 has hung, for example if the SDC 112 does not respond to the CPU 302 within a predetermined amount of time. The obtained state information 310 can then be presented to a user for use in debugging the SDC 112. The program source code 102 can then be modified to address any performance issues and the process described above can be repeated.

Figure 4:
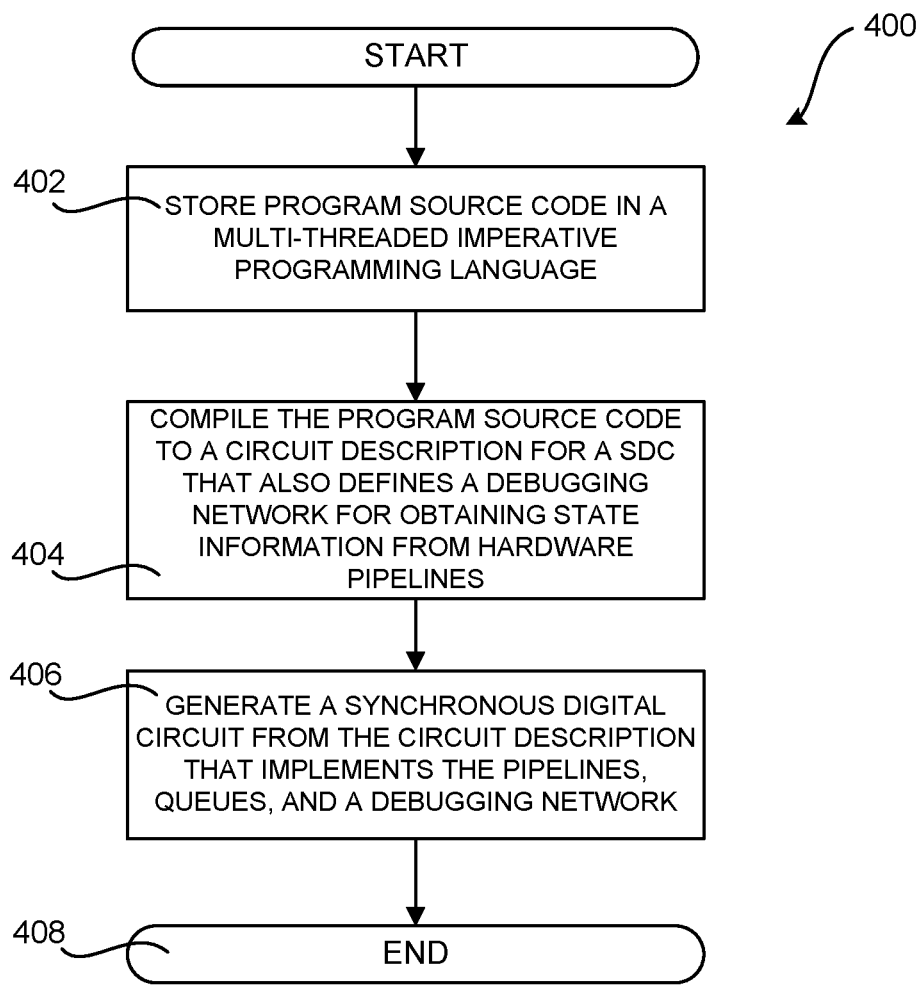
FIG. 4 is a flow diagram showing a routine that illustrates aspects of the operation of the technologies described with reference to FIGS. 1-3 for generating a synchronous digital circuit that includes a debugging network.

FIG. 4 is a flow diagram showing a routine 400 that illustrates aspects of the operation of the technologies described with reference to FIGS. 1-3 for generating a SDC 112 that includes a debugging network 308, according to one embodiment disclosed herein. It should be appreciated that the logical operations described herein with regard to FIG. 4, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 400 begins at operation 402, where program source code 102 is defined and stored in an imperative multi-threaded programming language. As discussed above, the source code 102 can be compiled to generate a SDC 112 that includes pipelines 200 and queues 202 that interconnect the pipelines.

From operation 402, the routine 400 proceeds to operation 404, where the compiler 104 compiles the program source code 102 to generate a circuit description for the SDC 112. As discussed above, the circuit description might be expressed as HDL code 106. As also discussed above, the compiler 104 also adds data to the circuit description that defines a debugging network for the SDC 112 through which a CPU 302 of a host device 300 can obtain state information 310.

From operation 404, the routine 400 proceeds to operation 406, where the circuit description (e.g. HDL code) is utilized to generate an SDL 112 that implements the pipelines 200, the queues 202, and the debugging network 308. As discussed above, the SDL 112 might be implemented in an FPGA, a Gate Array, an ASIC, or another type of circuit device. The routine 400 then proceeds from operation 406 to operation 408, where it ends.

Figure 5:
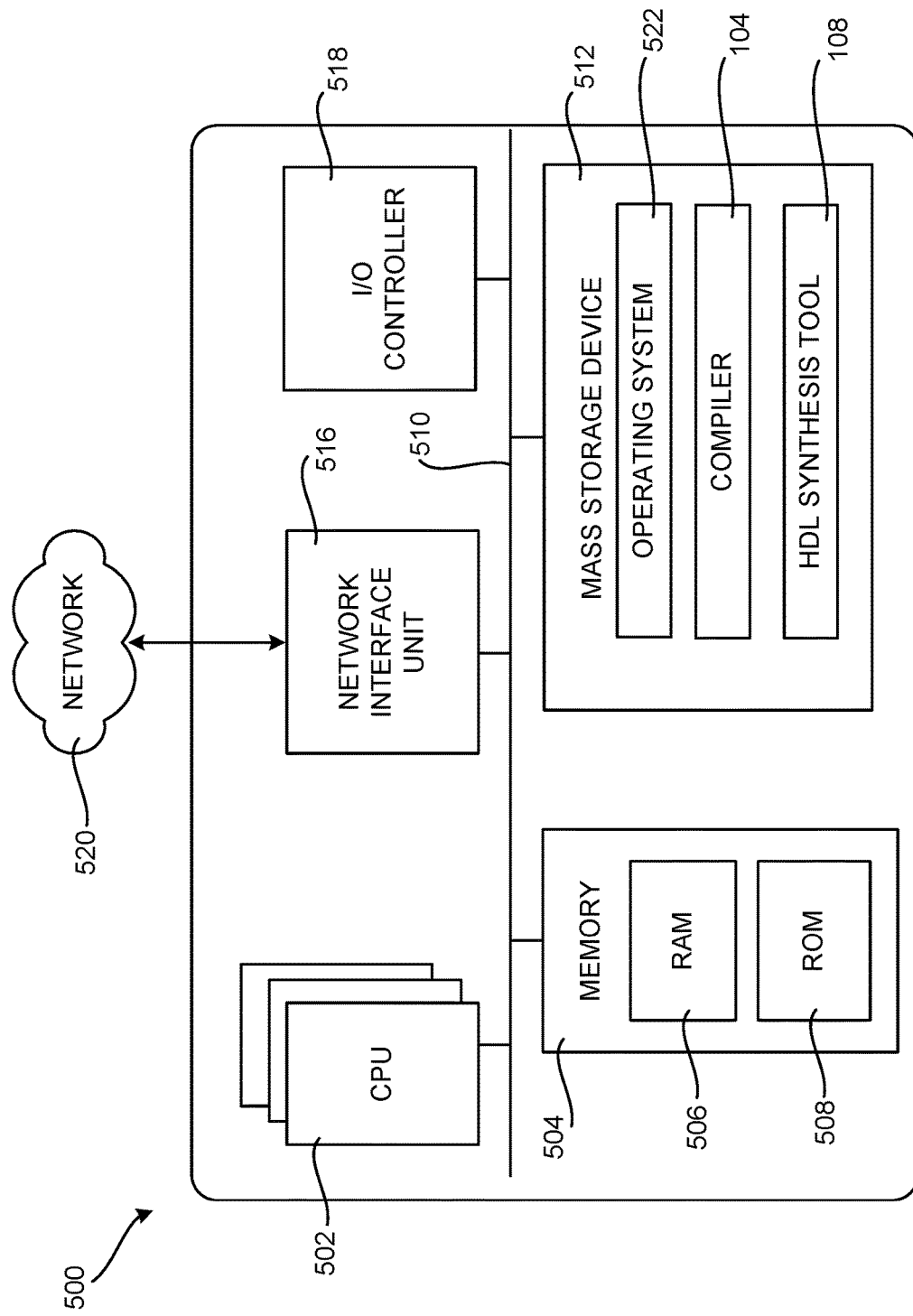
FIG. 5 is a computer architecture diagram showing an illustrative computer hardware and software architecture for a computing device that can implement aspects of the technologies presented herein.

FIG. 5 is a computer architecture diagram showing an illustrative computer hardware and software architecture for a computing device that can implement the various technologies presented herein. In particular, the architecture illustrated in FIG. 5 can be utilized to implement a server computer, mobile phone, an e-reader, a smartphone, a desktop computer, a tablet computer, a laptop computer, or another type of computing device.

The computer 500 illustrated in FIG. 5 includes a central processing unit 502 ("CPU"), a system memory 504, including a random-access memory 506 ("RAM") and a read-only memory ("ROM") 508, and a system bus 510 that couples the memory 504 to the CPU 502. A basic input/output system ("BIOS" or "firmware") containing the basic routines that help to transfer information between elements within the computer 500, such as during startup, can be stored in the ROM 508. The computer 500 further includes a mass storage device 512 for storing an operating system 522, application programs, and other types of programs, such as the compiler 104 and the HDL synthesis tool 108. The mass storage device 512 can also be configured to store other types of programs and data.

The mass storage device 512 is connected to the CPU 502 through a mass storage controller (not shown) connected to the bus 510. The mass storage device 512 and its associated computer readable media provide non-volatile storage for the computer 500. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 500.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 500. For purposes of the claims, the phrase "computer storage medium," and variations thereof, does not include waves or signals per se or communication media.

According to various configurations, the computer 500 can operate in a networked environment using logical connections to remote computers through a network such as the network 520. The computer 500 can connect to the network 520 through a network interface unit 516 connected to the bus 510. It should be appreciated that the network interface unit 516 can also be utilized to connect to other types of networks and remote computer systems. The computer 500 can also include an input/output controller 518 for receiving and processing input from a number of other devices, including a keyboard, mouse, touch input, an electronic stylus (not shown in FIG. 5), or a physical sensor such as a video camera. Similarly, the input/output controller 518 can provide output to a display screen or other type of output device (also not shown in FIG. 5).

It should be appreciated that the software components described herein, when loaded into the CPU 502 and executed, can transform the CPU 502 and the overall computer 500 from a general-purpose computing device into a special-purpose computing device customized to facilitate the functionality presented herein. The CPU 502 can be constructed from any number of transistors or other discrete circuit elements, which can individually or collectively assume any number of states. More specifically, the CPU 502 can operate as a finite-state machine, in response to executable instructions contained within the software modules disclosed herein. These computer-executable instructions can transform the CPU 502 by specifying how the CPU 502 transitions between states, thereby transforming the transistors or other discrete hardware elements constituting the CPU 502.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 500 in order to store and execute the software components presented herein. It also should be appreciated that the architecture shown in FIG. 5 for the computer 500, or a similar architecture, can be utilized to implement other types of computing devices, including hand-held computers, video game devices, embedded computer systems, mobile devices such as smartphones, tablets, and other types of computing devices known to those skilled in the art. It is also contemplated that the computer 500 might not include all of the components shown in FIG. 5, can include other components that are not explicitly shown in FIG. 5, or can utilize an architecture completely different than that shown in FIG. 5.

Figure 6:
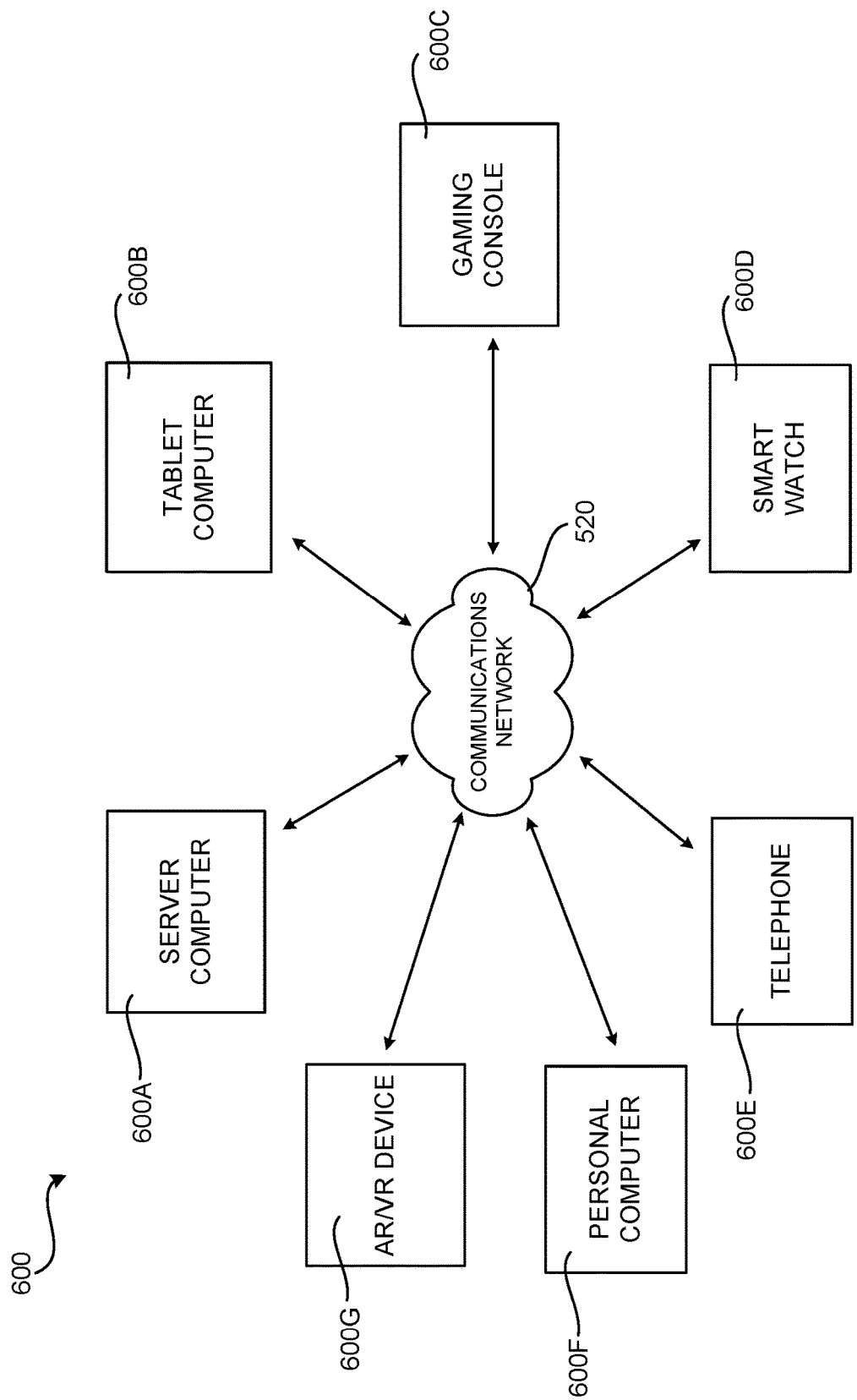
FIG. 6 is a network diagram illustrating a distributed computing environment in which aspects of the disclosed technologies can be implemented.

FIG. 6 is a network diagram illustrating a distributed network computing environment 600 in which aspects of the disclosed technologies can be implemented, according to various embodiments presented herein. As shown in FIG. 6, one or more server computers 600A can be interconnected via a communications network 520 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 600B, a gaming console 600C, a smart watch 600D, a telephone 600E, such as a smartphone, a personal computer 600F, and an AR/VR device 600G.

In a network environment in which the communications network 520 is the Internet, for example, the server computer 600A can be a dedicated server computer operable to process and communicate data to and from the client computing devices 600B-600G via any of a number of known protocols, such as, hypertext transfer protocol ("HTTP"), file transfer protocol ("FTP"), or simple object access protocol ("SOAP"). Additionally, the networked computing environment 600 can utilize various data security protocols such as secured socket layer ("SSL") or pretty good privacy ("PGP"). Each of the client computing devices 600B-600G can be equipped with an operating system operable to support one or more computing applications or terminal sessions such as a web browser (not shown in FIG. 6), or other graphical user interface (not shown in FIG. 6), or a mobile desktop environment (not shown in FIG. 6) to gain access to the server computer 600A.

The server computer 600A can be communicatively coupled to other computing environments (not shown in FIG. 6) and receive data regarding a participating user's interactions/resource network. In an illustrative operation, a user (not shown in FIG. 6) may interact with a computing application running on a client computing device 600B-600G to obtain desired data and/or perform other computing applications.

The data and/or computing applications may be stored on the server 600A, or servers 600A, and communicated to cooperating users through the client computing devices 600B-600G over an exemplary communications network 520. A participating user (not shown in FIG. 6) may request access to specific data and applications housed in whole or in part on the server computer 600A. These data may be communicated between the client computing devices 600B-600G and the server computer 600A for processing and storage.

The server computer 600A can host computing applications, processes and applets for the generation, authentication, encryption, and communication of data and applications, and may cooperate with other server computing environments (not shown in FIG. 6), third party service providers (not shown in FIG. 6), network attached storage ("NAS") and storage area networks ("SAN") to realize application/data transactions.

It should be appreciated that the illustrative computing architecture shown in FIG. 7 and the illustrative distributed network computing environment shown in FIG. 6 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A computer-implemented method, comprising: storing source code in a multi-threaded imperative programming language; and compiling the source code in the multi-threaded imperative programming language into a circuit description for a synchronous digital circuit, wherein the circuit description further comprises data defining a debugging network connected to a plurality of pipelines, and wherein a central processing unit (CPU) connected to the synchronous digital circuit can query the plurality of pipelines for state information by way of the debugging network.

Clause 2. The computer-implemented method of clause 1, further comprising generating the synchronous digital circuit from the circuit description.

Clause 3. The computer-implemented method of any of clauses 1-2, wherein the debugging network comprises serial connections between the plurality of pipelines.

Clause 4. The computer-implemented method of any of clauses 1-3, wherein the queues comprise one or more input queues, and wherein the state information comprises data indicating an input queue is empty.

Clause 5. The computer-implemented method of any of clauses 1-4, wherein the queues comprise one or more output queues, and wherein the state information comprises data indicating the state of one of the one or more output queues.

Clause 6. The computer-implemented method of any of clauses 1-5, wherein the state information comprises data indicating that whether a wait condition has been satisfied.

Clause 7. The computer-implemented method of any of clauses 1-6, wherein the synchronous digital circuit is implemented in a field-programmable gate array (FPGA), a gate array, or ASIC.

Clause 8. A computer, comprising: a central processing unit (CPU); and at least one computer storage medium storing program source code in a multi-threaded imperative programming language, and a plurality of instructions, which when executed by the CPU, will cause the processor to compile the program source code in the multi-threaded imperative programming language into a circuit description for the synchronous digital circuit, wherein the circuit description further comprises data defining a debugging network connected to a plurality of pipelines, and wherein the plurality of pipelines can be queried for state information by way of the debugging network.

Clause 9. The computer of clause 8, wherein the at least one computer storage medium stores further instructions for generating the synchronous digital circuit from the circuit description.

Clause 10. The computer of any of clauses 8-9, wherein the debugging network comprises serial connections between the plurality of pipelines.

Clause 11. The computer of any of clauses 8-10, wherein the queues comprise one or more input queues, and wherein the state information comprises data indicating an input queue is empty.

Clause 12. The computer of any of clauses 8-11, wherein the queues comprise one or more output queues, and wherein the state information comprises data describing a state of one of the one or more output queues.

Clause 13. The computer of any of clauses 8-12, wherein the state information comprises data indicating that whether a wait condition has been satisfied.

Clause 14. The computer of any of clauses 8-13, wherein the synchronous digital circuit is implemented in a field-programmable gate array (FPGA), a gate array, or ASIC.

Clause 15. A synchronous digital circuit, comprising: a plurality of pipelines; queues connecting the plurality of pipelines; and a debugging network configured for connection to a central processing unit (CPU), wherein the CPU can query the pipelines for state information by way of the debugging network, and wherein the synchronous digital circuit is generated based upon a circuit description generated from program source code in a multi-threaded imperative programming language.

Clause 16. The synchronous digital circuit of clause 15, wherein the debugging network comprises serial connections between the plurality of pipelines.

Clause 17. The synchronous digital circuit of any of clauses 15-16, wherein the queues comprise one or more input queues, and wherein the state information comprises data indicating an input queue is empty.

Clause 18. The synchronous digital circuit of any of clauses 15-17, wherein the queues comprise one or more output queues, and wherein the state information comprises data describing the state of at least one of the one or more output queues.

Clause 19. The synchronous digital circuit of any of clauses 15-18, wherein the state information comprises data indicating that whether a wait condition has been satisfied.

Clause 20. The synchronous digital circuit of any of clauses 15-19, wherein the synchronous digital circuit is implemented in a field-programmable gate array (FPGA), a gate array, or ASIC.

Based on the foregoing, it should be appreciated that technologies for generating a debugging network for a SDC during compilation of program source code in a multi-threaded imperative programming language have been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method for generating and debugging synchronous digital circuits, comprising:

storing source code in a multi-threaded imperative programming language;

compiling the source code in the multi-threaded imperative programming language into a circuit description for a synchronous digital circuit, wherein the circuit description comprises data defining a debugging network connected to a plurality of pipelines;

automatically generating, by a central processing unit (CPU) connected to the synchronous digital circuit, a debugging request to query the plurality of pipelines for state information by way of the debugging network; and providing the debugging request to the debugging network to query the plurality of pipelines for state information, wherein the debugging request is provided automatically in response to determining that a predetermined time period has elapsed.

2. The computer-implemented method of claim 1, further comprising generating the synchronous digital circuit from the circuit description.

3. The computer-implemented method of claim 1, wherein the debugging network comprises serial connections between the plurality of pipelines.

4. The computer-implemented method of claim 1, wherein the plurality of pipelines are connected by queues, the queues comprising one or more input queues, and wherein the state information comprises data indicating an input queue is empty.

5. The computer-implemented method of claim 1, wherein the plurality of pipelines are connected by queues, the queues comprising one or more output queues, and wherein the state information comprises data indicating the state of one of the one or more output queues.

6. The computer-implemented method of claim 1, wherein the state information comprises data indicating that a wait condition has been satisfied.

7. The computer-implemented method of claim 1, wherein the predetermined time period is defined to enable the CPU to query the plurality of pipelines each time the predetermined time period elapses.

8. The computer-implemented method of claim 1, wherein the predetermined time period is based on performance of the synchronous digital circuit being hung and the synchronous digital circuit does not respond to a previous debugging request within the predetermined time period.

9. A computer for generating and debugging synchronous digital circuits, comprising:

a central processing unit (CPU); and at least one computer storage medium storing program source code in a multi-threaded imperative programming language, and a plurality of instructions, which when executed by the CPU, cause the processor to:

compile the program source code in the multi-threaded imperative programming language into a circuit description for a synchronous digital circuit, wherein the circuit description comprises data defining a debugging network connected to a plurality of pipelines;

automatically generate a debugging request to query the plurality of pipelines for state information by way of the debugging network; and provide the debugging request to the debugging network to query the plurality of pipelines for state information, wherein the debugging request is provided automatically in response to determining that a predetermined time period has elapsed.

10. The computer of claim 9, wherein the at least one computer storage medium stores further instructions for generating the synchronous digital circuit from the circuit description.

11. The computer of claim 9, wherein the debugging network comprises serial connections between the plurality of pipelines.

12. The computer of claim 9, wherein the plurality of pipelines are connected by queues, the queues comprising one or more input queues, and wherein the state information comprises data indicating an input queue is empty.

13. The computer of claim 9, wherein the plurality of pipelines are connected by queues, the queues comprising one or more output queues, and wherein the state information comprises data describing a state of one of the one or more output queues.

14. The computer of claim 9, wherein the state information comprises data indicating that a wait condition has been satisfied.

15. A synchronous digital circuit, comprising:

a plurality of pipelines;

queues connecting the plurality of pipelines; and a debugging network configured for connection to a central processing unit (CPU), wherein the CPU automatically generates a debugging request to query the plurality of pipelines for state information by way of the debugging network, wherein the synchronous digital circuit is automatically generated based upon a circuit description generated from program source code in a multi-threaded imperative programming language, and wherein the debugging request is provided to the debugging network by the CPU to query the plurality of pipelines for state information, wherein the debugging request is provided automatically in response to determining that a predetermined time period has elapsed.

16. The synchronous digital circuit of claim 15, wherein the debugging network comprises serial connections between the plurality of pipelines.

17. The synchronous digital circuit of claim 15, wherein the queues comprise one or more input queues, and wherein the state information comprises data indicating an input queue is empty.

18. The synchronous digital circuit of claim 15, wherein the queues comprise one or more output queues, and wherein the state information comprises data describing the state of at least one of the one or more output queues.

19. The synchronous digital circuit of claim 15, wherein the state information comprises data indicating that a wait condition has been satisfied.

20. The synchronous digital circuit of claim 15, wherein the synchronous digital circuit is implemented in a field-programmable gate array (FPGA), a gate array, or ASIC.

* * * * *